United States Patent [19]
Moulton et al.

[11] Patent Number: 5,853,297
[45] Date of Patent: Dec. 29, 1998

[54] SYSTEM AND METHOD FOR CO-PLANAR AND NEARLY CO-PLANAR PRINTED CIRCUIT BOARD EXTENSION DOCKING SYSTEM

[75] Inventors: Harland Timothy Moulton, Winter Park; Stephen H. Goldman, Maitland, both of Fla.

[73] Assignee: Distributed Processing Technology Corporation, Maitland, Fla.

[21] Appl. No.: 666,076

[22] Filed: Jun. 19, 1996

[51] Int. Cl.[6] .................................................. H01R 13/62
[52] U.S. Cl. ........................................... 439/327; 439/377
[58] Field of Search .................................... 439/325, 326, 439/327, 62–65, 152–159, 377, 629–37

[56] References Cited

U.S. PATENT DOCUMENTS

| | | |
|---|---|---|
| 4,416,496 | 11/1983 | Brefka . |
| 4,840,570 | 6/1989 | Mann, Jr. et al. ................... 439/327 X |
| 4,938,701 | 7/1990 | Heberling ............................. 439/327 X |
| 4,980,856 | 12/1990 | Ueno ........................................ 364/900 |
| 5,184,282 | 2/1993 | Kaneda et al. ........................... 361/395 |
| 5,193,052 | 3/1993 | Larson et al. ............................ 361/395 |
| 5,326,277 | 7/1994 | Kuramitsu ................................. 439/327 |

*Primary Examiner*—Khiem Nguyen
*Attorney, Agent, or Firm*—Roberts & Brownell, LLC

[57] ABSTRACT

A System and Method for the multi-contact co-planar or nearly co-planar edge-to-edge electrical connection of printed circuit boards that embodies an electrical connection between the printed circuit boards and a rigid latching physical connection between the printed circuit boards. Electrical and physical connections of PCBs are simultaneously accomplished by the user through a quick and easy connection and disconnection mechanism without damage to any components. A latching mechanism on the second PCB cooperates with a shaped mating end of a first PCB whereby the second PCB slides onto and latches with the first PCB. Cantilever beam springs on either side of the second PCB permits the two PCB's to positively engage one another to form a stable rigid connection of the two PCB's.

30 Claims, 5 Drawing Sheets

SYSTEM AND METHOD FOR CO-PLANAR
AND NEARLY CO-PLANAR PRINTED
CIRCUIT BOARD EXTENSION DOCKING
SYSTEM

FIELD OF THE INVENTION

This invention relates generally to a system and method for multi-contact electrical connection of printed circuit boards (PCB's) and more specifically to a system and method whereby the PCB's are connected in a co-planar or nearly co-planar edge-to-edge fashion providing multi-contact electrical connection between the PCB's with an interlocking and latching rigid physical connection which can be quickly and easily connected and released without damage to any components.

DESCRIPTION OF RELATED ART

Users desire to connect PCB's for a number of reasons. Those reasons include lower manufacturing costs for smaller PCB's, higher production yield for less complex PCB's, and expanded functionality of the main PCB through addition of optional circuitry on a second PCB. One method of connection between two PCB's is that used in the traditional personal computer. In a personal computer the motherboard is a large complex PCB. The user generally desires to connect smaller or less complex PCB's, providing various control or peripheral interfaces, to the motherboard. In the personal computer, those connections occur generally through a perpendicular multi-contact electrical connection between the motherboard and the peripheral boards. To maintain the connection in the personal computer, the PCB's rely on a friction fit in the electrical connection in addition to a physical connection of both PCB's to the personal computer case. This method of connection ensures reliable electrical connection with a physical support structure to prevent accidental disengagement. While the perpendicular method used for the personal computer allows connection among PCB's, it results in a larger package volume. For many applications, especially those with space constraints, an edge-to-edge co-planar connection of PCB's is a more desirable method.

Methods for multi-contact PCB edge-to-edge connectors having a sliding friction fit between two mating multi-contact devices have been the subject of invention. These generally embody a male type connector on one PCB and a female type connection on the second PCB. That sliding friction fit with flexible electrical contacts provides the required multi-contact electrical connection, but offers very limited physical engagement between the two PCB's. This type of friction fit connection, without additional physical engagement, is illustrated in U.S. Pat. No. 4,980,856 to Ueno and in U.S. Pat. No. 5,184,282 to Kaneda and Villwock. As illustrated by Ueno and Kaneda, the edge-to-edge connection does allow a multi-contact electrical connection, but that electrical connection may disengage if the two connected PCB's are subject to external force that might result from movement, shock or vibration. The method illustrated in Ueno, is particularly susceptible to disengagement because the boards are depicted as long elements. Thus, an in-plane orthogonal force on a board would have a lever effect tending to separate the connection. The disclosures of Ueno and Kaneda do not provide any additional elements that would add stability to the connected boards. The PCB's are only held together with friction.

U.S. Pat. No. 5,193,052 to Larson and Wilkinson provides an edge-to-edge multi-contact connection between a computer printer font cartridge and an extension unit. This entails connection of internal PCB's and an external spring latching connection device. This disclosure does allow the desired multi-contact electrical connection together with a form of latching physical connection between the cartridge and the extension unit. The Larson invention also resists disengagement that might result from movement, shock or vibration. However, the physical connection method of Larson is entirely dependant on the physical structure of the font cartridge and is not readily suited to connection and latching of PCB's, one to another.

U.S. Pat. No. 4,416,496 to Brefka, also describes a method for achieving an edge-to-edge multi-contact electrical connection together with a physical connection between the two PCB's. The resulting connection of Brejka results in a relatively secure connection unaffected by movement, force or vibration. However, the method described to achieve the secure physical connection requires a screw on each side of the connector to maintain the physical connection of PCB's. This method of Brejka, requiring more time to effect the connection as well as the use of additional tools, is not an optimal or appropriate implementation for many user environments. Additionally, the method of Brejka may be inappropriate for certain production environments or applications where metallic fasteners are not desired.

None of the above patents or existing technology addresses the need for a multi-connector co-planar or nearly co-planar edge-to-edge electrical connector for PCB's that embodies a rigid latching physical connection that may be quickly and easily connected and released by the user without damage to any components, and can be accomplished with metallic or non-metallic components where desirable.

SUMMARY OF THE INVENTION

It is therefore an objective of the present invention to provide a method for connecting two printed circuit boards in a co-planar or nearly co-planar edge-to-edge manner through a multi-contact electrical connection that is secured with an interlocking and latching rigid physical connector that results in a rigid physical and electrical connection between PCB's.

It is a further object of the present invention to provide that electrical and physical connection in a manner that allows quick and easy connection and disconnection by the user or manufacturer without special tools.

It is a further object of the present invention to provide electrical and physical connection of PCB's using a resilient moldable plastic or machinable material to form snap fit fasteners.

It is a further object of the present invention to provide electrical and physical connection of PCB's by modifying the specific shape of both first PCB and second PCB in the region of the connection to permit more positive docking.

It is a further object of the present invention to provide electrical and physical connection using a squeeze-to-release design that simplifies connection and disconnection.

It is a further object of the present invention to provide for electrical and physical connection of PCB's that is easily fabricated, assembled and applied by a variety of manufacturing techniques.

It is a further object of the present invention to provide electrical and physical connection of PCB's to accommodate PCB's with significant variances in nominal board thickness.

It is a further object of the present invention to provide the electrical and physical connection of PCB's at a low cost for both materials and assembly.

It is a further object of the present invention to provide electrical and physical connection of PCB's with minimal cost burden to the first printed circuit board.

It is a further object of the present invention to provide electrical and physical connection of PCB's requiring a minimum amount of printed circuit board space.

It is a further object of the present invention to provide electrical and physical connection of PCB's by attachment of physical connection (or latching) devices by adhesive bonding, high speed staking methods, screws, nuts and bolts and other fastening methods.

It is a further object of the present invention to provide electrical and physical connection of PCB's with a method that will provide both torsional and in-plane orthogonal rigidity, between the two PCB's.

These and other objectives of the present invention will become obvious to those skilled in the art upon review of the following disclosure.

The present invention combines a method of co-planar and nearly co-planar electrical and physical connection between two PCB's whereby the electrical connection relies on engagement of multi-contact connectors and the physical connection depends on a snap fit latching system that relies on a modification to the shape of the mating end of a first PCB and a second PCB with connecting latches which correspond to the specific mating shape on the first PCB. Using the present invention a person can easily and reliably electrically and physically connect two PCB's and easily disconnect them should the need arise.

DETAILED DESCRIPTION OF THE PREFERRED EMBODIMENT

Figure 1:
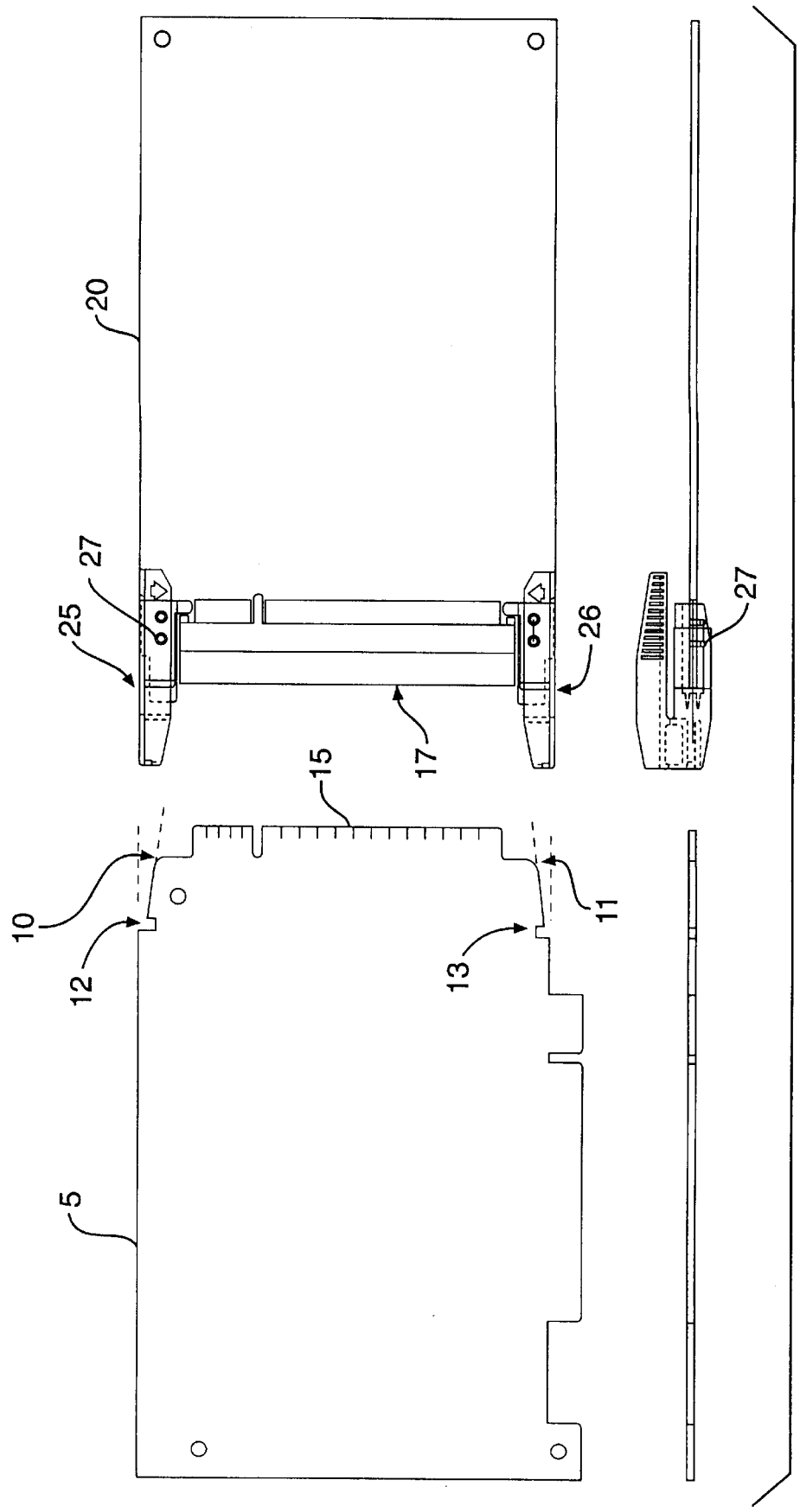
FIG. 1: A first PCB and second PCB modified according to the invention, with the shaping of the first PCB, and showing the locations of the electrical connectors.

Referring to FIG. 1, the preferred embodiment of the present invention is shown. The end of a first PCB 5 is shaped with angle elements 10, 11 to gradually narrow the width of the end of the first PCB (the mating end), together with corresponding opposing notches 12, 13 on the mating end of the first PCB. The preferred embodiment is further enabled by providing a first multi-connector electrical contact 15 between the angle elements 10, 11 along the mating end of the first PCB 5. The second PCB 20, to be joined with the first PCB 5, has opposing latching fixtures 25, and 26 which are attached to the end of the second PCB 20 by fastening means 27. The second PCB 20 has a second multi-connector electrical contact 17 which is attached by a different set of fastening means between the opposing latching fixtures 25 and 26 on the end of the second PCB 20. The opposing latching fixtures 25 and 26 are constructed of flexible, resilient moldable or machinable materials in such a fashion that deformation of the latching fixtures creates a spring preload action. The deforming portions of the latching fixtures each form a cantilever beam spring.

To accomplish the physical and electrical connection, the user simultaneously aligns the first electrical contact 15 on the first PCB with the second electrical contact 17 on the second PCB, at the same time engaging the angle elements 10 and 11 on the mating end of the first PCB with the opposing latching fixtures 25 and 26 on the second PCB. As the user applies force on the first PCB 5 and the second PCB 20 to push them toward each other in a coplanar fashion, the opposing latching fixtures 25 and 26 on the second PCB 20 deform providing a spring preload mating action against the angle elements 10 and 11 of the first PCB 5. As the opposing latching fixtures provide the preload, the two electrical contacts engage, creating a multi-contact friction electrical connection between the first PCB 5 and the second PCB 20. As the user applies additional coplanar force on the first PCB 5 and the second PCB 20, an engagement lug on each of the opposing latching fixtures 25 and 26 reaches a corresponding position with the opposing notches 12 and 13 on the mating end of the first PCB 5. This corresponding position between the notches 13 and the engagement lugs on the latching fixtures 25 and 26 allows the first PCB 5 and the second PCB 20 to physically connect and lock into position at the same time that the multi-connector electrical connection between the first electrical contact 15 and the second electrical contact 17 is made providing an electrical connection between the first PCB and the second PCB.

Figure 2:
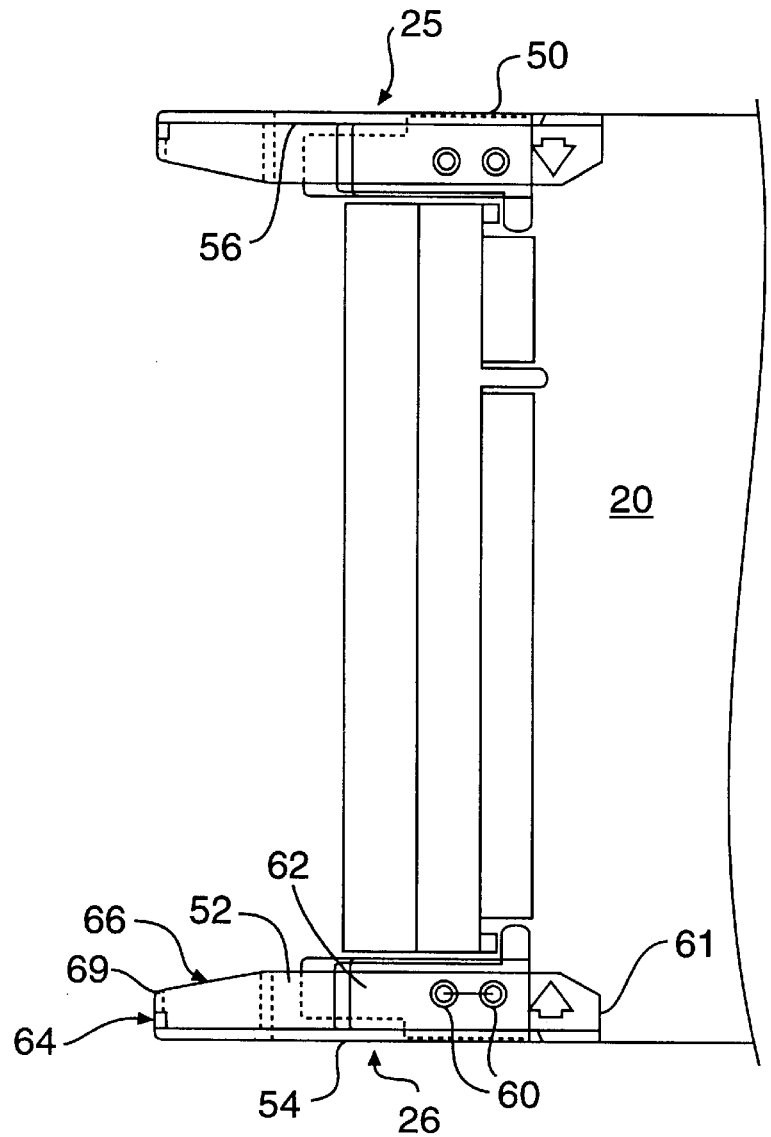
FIG. 2: The preferred embodiment and the relationship of the latching fixtures to the second PCB with the design of the latching fixtures.
Figure 3:
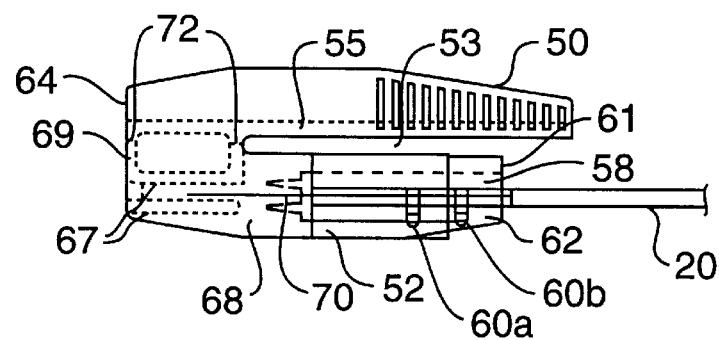
FIG. 3: The preferred embodiment and design of the latching fixtures.

Referring to FIGS. 2 and 3, the latching mechanism is shown in more detail. The preferred embodiment of the present invention involves a unique design of the opposing latching fixtures. Each latching fixture includes a cantilever beam spring or spring arm 50, which is an extension of the main body 52, and which is separated from the main body by an elongate opening 53. The main body has an outer face 54, and an inner face 56, with a mounting bracket 58, that is perpendicular to the inner face 56. To provide stiffness, the spring arm 50 has a perpendicular rib 55 which is on the inner face 56. The mounting bracket 58, has two integral pins 60a and 60b, near a first end 61, which penetrate the second PCB 20, in corresponding holes in PCB 20 openings to form an attachment means. The integral pins 60a, 60b, possessing a plurality of sacrificial ribs running the length of the pins, which shear during insertion and permit an interference fit in a situation where the corresponding mating openings in the second PCB are slightly undersized. The integral pins engage corresponding openings in a backing plate 62, and are staked to form a permanent attachment means of the latching fixtures 25 and 26 to the second PCB 20.

Alternatively, in place of the integral pins 60, the flat surface of the latching fixture can be used to provide a permanent attachment means of the latching fixture to the second PCB by an adhesive bonding means, via bolts and nuts, or other staking or attachment means known in the art.

The second end 64 of the latching fixture, incorporates another perpendicular engagement element 66, that is located on the latching fixture inner face 56. This engagement element 66, consists of two opposing faces 67 separated by the maximum thickness of a PCB. These opposing faces serve to locate the first PCB during the connection. The engagement element 66 contains a locking lug 69 which cooperates with the notches 12 on the mating end of the first PCB (see FIG. 1). The engagement element 66 is not an extension of the mounting bracket 58, though both lie in the same plane. It is this separation between the engagement element 66 and the mounting bracket 58, with connection through the bridge area 68, on the main body 52 of the latching fixture, which provides the flexible spring preload action of the latching fixture during connection. On the end of the mounting bracket 58, which is nearest the bridge area 68, there is a U shaped receptacle 70, which engages the end of the first PCB once the connection is complete, thereby providing additional coplanar alignment and preload of the first and second PCB's. To provide additional stiffness near the second end 64 of the latching fixture, there are additional stiffening ribs 72, which connect the perpendicular rib 55, with one of the opposing faces 67.

Figure 4:
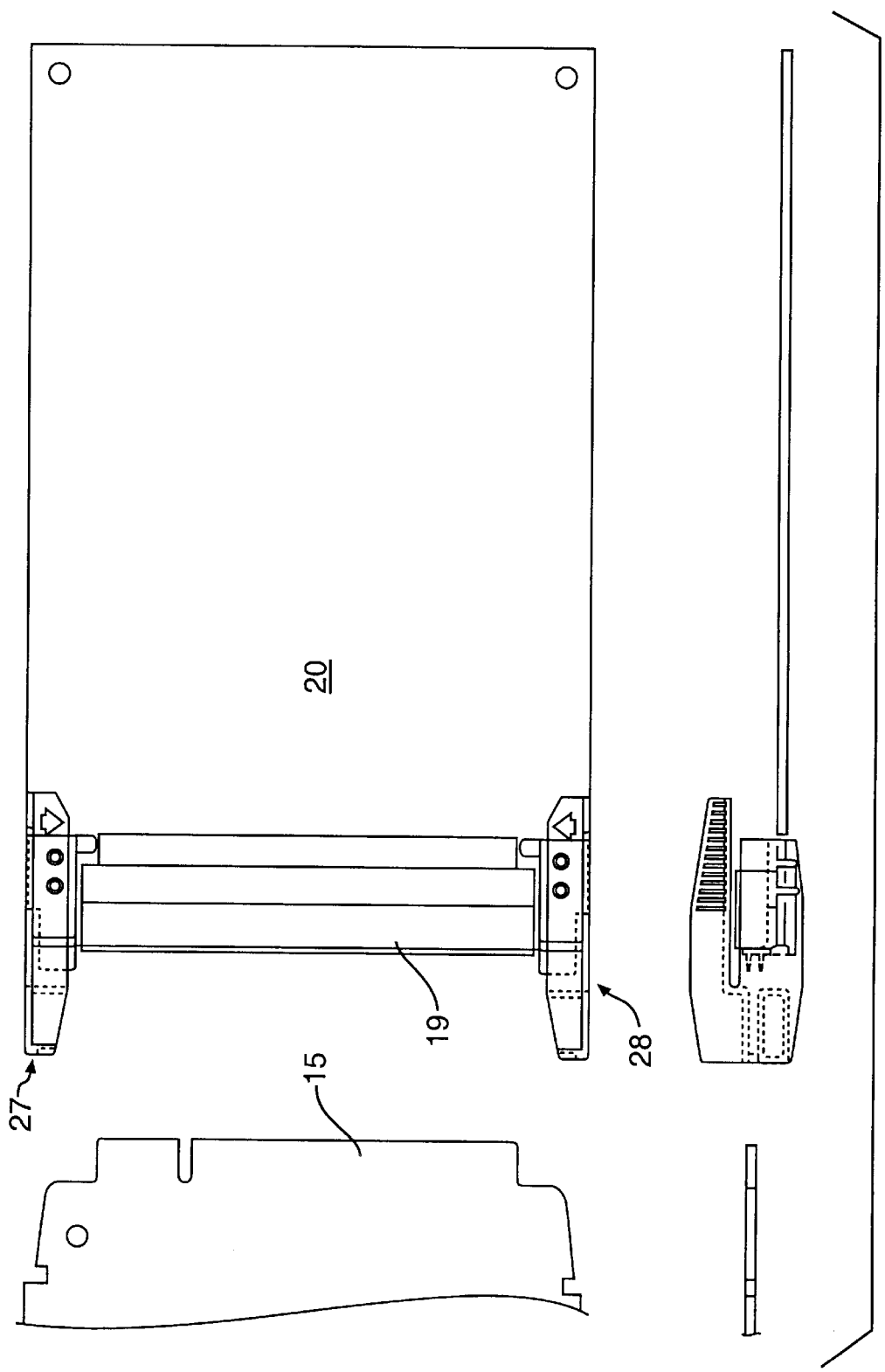
FIG. 4: Alternative embodiment with nearly co-planar structure.

Referring to FIG. 4, an alternative embodiment of the present invention is shown. This configuration involves a slight parallel offset from the coplanar arrangement of the preferred embodiment (hereinafter referred to as nearly co-planar). In the alternative embodiment, the first PCB 5 is unchanged and retains all the elements of FIG. 1, with the modifications of the alternative embodiment incorporated in the opposing latching fixtures 27 and 28, and location of the second multi-connector electrical contact 19 on the second PCB 20. In this alternative embodiment, the second multi-connector electrical contact 19 is surface mounted on the second PCB 20, as compared to being edge mounted in the preferred embodiment illustrated in FIG. 1. The opposing latching fixtures 27 and 28 are constructed to allow the first multi-connector electrical contact 15 on the first PCB 5 to engage the second multi-connector electrical contact 19 which is surface mounted on the second PCB 20.

Figure 5:
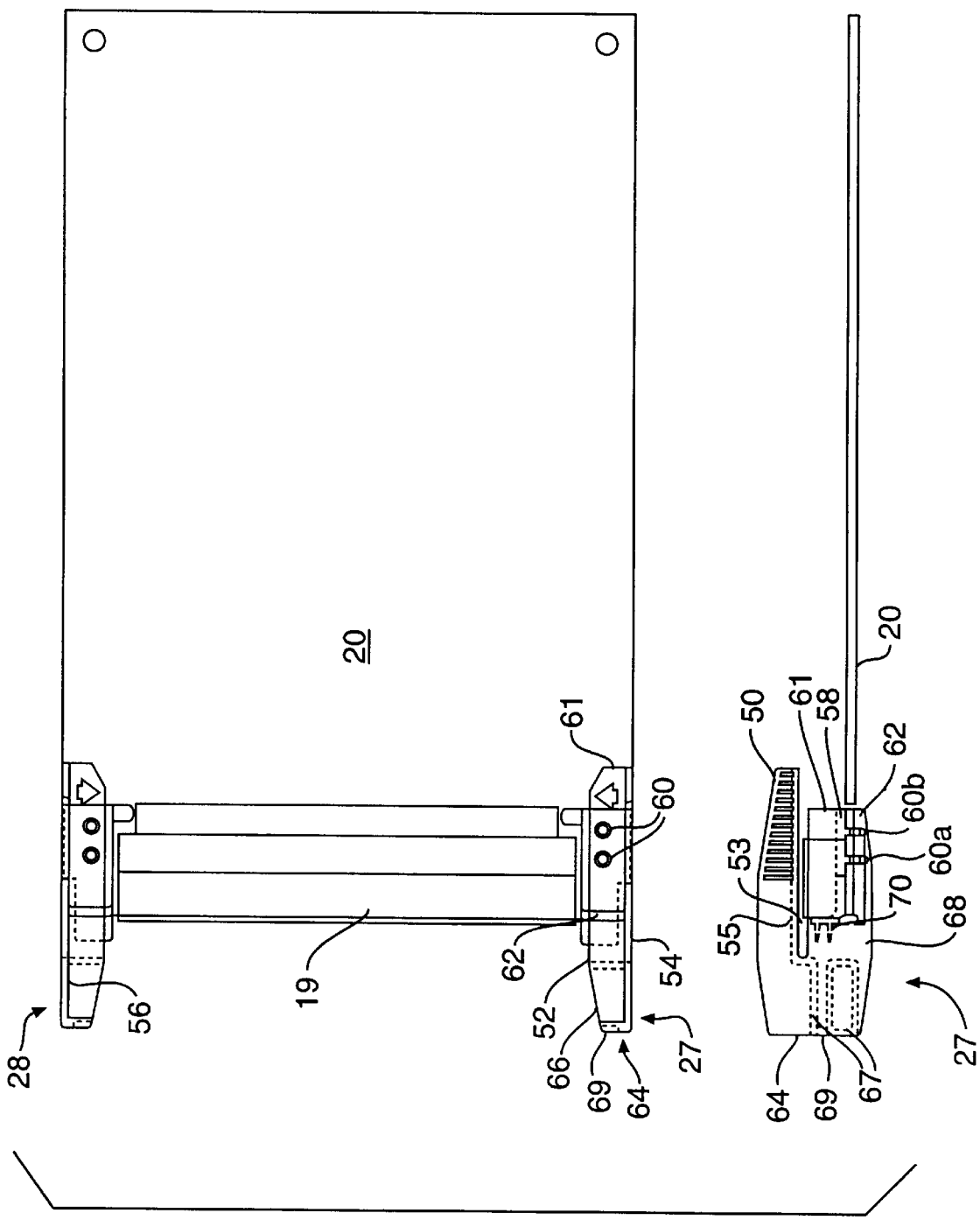
FIG. 5: Alternative embodiment of the latching mechanism.

Referring to FIG. 5, the alternative embodiment of the present invention involves a unique design of the opposing latching fixtures 27 and 28. Each latching fixture includes a spring arm 50, which is an extension of the main body 52, and is separated from the main body by an elongate opening 53. The main body has an outer face 54, and an inner face 56, with a mounting bracket 58, that is perpendicular to the inner face 56. To provide stiffness, the spring arm 50 has a perpendicular rib 55 which is on the inner face 56. The mounting bracket 58, has two integral pins 60a and b, near a first end 61, which penetrate the second PCB 20, in corresponding openings to form an attachment means. The integral pins 60, possessing a plurality of sacrificial ribs running the length of the pins, which shear during insertion and permit an interference fit in a situation where the corresponding mating openings in the second PCB are slightly undersized. The integral pins engage corresponding openings in a backing plate 62, and are staked to form a permanent attachment means of the latching fixture 27 to the second PCB 20.

Alternatively, in place of the integral pins 60, the flat surface of the latching fixture can be used to provide a permanent attachment means of the latching fixture to the second PCB by an adhesive bonding means or by nuts and bolts.

The second end 64 of the latching fixture 27, incorporates another perpendicular engagement element 66, that is located on the latching fixture inner face 56. This engagement element 66, consists of two opposing faces 67 separated by the maximum thickness of a PCB. These opposing faces serve to locate the first PCB during the connection. The engagement element 66 contains a locking lug 69 which cooperates with the notches 12 on the first PCB(See FIG. 1). The engagement element 66 is not an extension of the mounting bracket 58. It is this separation between the engagement element 66 and the mounting bracket 58, with connection through the bridge area 68, on the main body 52 of the latching fixture, which provides the flexible spring preload action of the latching fixture during connection. On the end of the mounting bracket 58, which is nearest the bridge area 68, there is a U-shaped receptacle 70, which engages the end of the first PCB once the connection is complete, thereby providing additional alignment and preload of the first and second PCB's. In the alternative embodiment, the engagement element 66 and the extension of the mounting bracket 58 are sufficiently offset to allow the end of the first PCB to engage the surface mounted second multi-connector electrical contact 19 on the second PCB 20.

Figure 6:
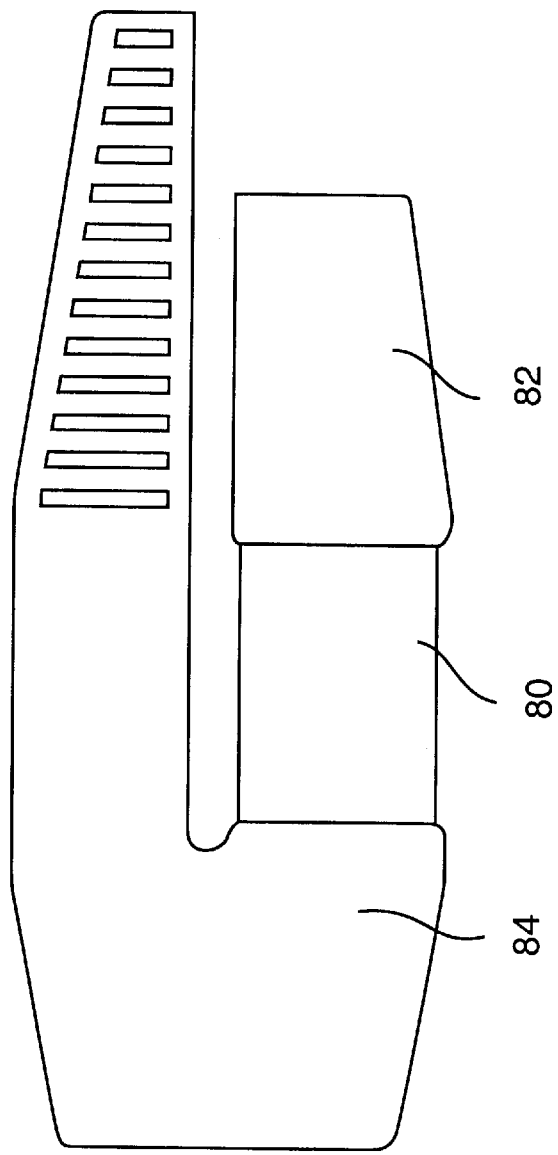
FIG. 6: Alternative embodiment of the cantilever beam spring.

Referring to FIG. 6 an alternative embodiment of the cantilever beam spring is shown. In this case the cantilever beam spring is partially composed of spring steel or other resilient metallic material 80. One end of the spring member is inserted into the cantilever beam spring 84, or, alternatively the plastic material of the latching mechanism is injection molded around he spring steel member. A plastic or other material handle 82 is attached to the other end of the metallic spring member and serves as the location at which a user would put pressure on the latching member in order to separate the two PCB's. The amount of spring preload is such that deformation of the cantilever beam spring is sufficient to disengage the two PCB's.

Thus a novel attachment method and apparatus is shown that allows attachment and disengagement of two PCB's to be achieved easily with minimal effort of a user. The attaching mechanism provide positives connection of two PCB's as well as a stable, rigid units when the two PCB's are joined together. Those skilled in the art will appreciate that other alternative embodiments of the present invention are possible without departing from the spirit of the invention as shown.

What is claimed is:

1. A method for establishing a co-planar or nearly co-planar electrical connection and a mechanical connection between a first and a second printed circuit board (PCB), comprising:

attaching spring latches on opposite side edges of the end of the second PCB, the second PCB having edge electrical connectors;

shaping a first and second side of the mating end of the first PCB;

creating engagement notches on the first and second side edges of the mating end of the first PCB; and sliding the spring latches of the second PCB, together with the second PCB onto the mating end of the first PCB sufficient to engage the spring latches with the engagement notches of the first PCB.

2. The method of claim 1 wherein the spring latches comprises cantilever beam springs.

3. The method of claim 1, wherein the shaping of the mating end of the first PCB comprises tapering the width of the mating end of the first PCB gradually so that the width of the mating end is less than the distance between the two spring latches of the second PCB.

4. The method of claim 2, wherein the cantilever beam spring latches comprise a squeeze-to-release design.

5. The method of claim 2, wherein the cantilever beam spring latches on the second PCB cooperate with the mating end of the first PCB to provide torsional and in-plane orthogonal rigidity between the first and second PCB'S.

6. The method of claim 2, further comprising permanently attaching said latches to the second PCB with a staking means.

7. The method of claim 2, further comprising permanently attaching the latches to the second PCB with an adhesive bonding means.

8. The method of claim 2, further comprising permanently attaching the latches to the second PCB with nuts and bolts.

9. The method of claim 2, further comprising permanently attaching the latches to the second PCB with screws.

10. The method of claim 2, further comprising constructing the cantilever beam spring latches of resilient material.

11. The method of claim 2, further comprising constructing the cantilever beam spring latches of moldable plastic.

12. The method of claim 2, further comprising constructing said latches of machinable material.

13. The method of claim 2, further comprising constructing the latches of a combination of moldable plastic and spring steel.

14. A co-planar edge-to-edge attachment fixture for PCB's comprising:
   a first PCB having a first edge, a second edge, and a mating end, where
      the mating end further comprising opposing engagement notches on the first and second edges of the PCB;
   a second PCB having a first edge, a second edge, and a connecting end; and
   spring latches which are fixedly attached to the first and second edges of the second PCB by an attachment means, where
      the spring latches further comprise engagement lugs which cooperate with the engagement notches on the first PCB to form a rigid attachment between the first and second PCBs.

15. The fixture of claim 14 wherein the spring latches comprise cantilever beam spring latches.

16. The fixture of claim 15 wherein the cantilever beam spring latches consist of resilient material.

17. The fixture of claim 16 wherein the resilient material is plastic.

18. The fixture of claim 15 wherein the cantilever beam spring comprises spring steel.

19. The fixture of claim 15 wherein the cantilever beam spring latches are fixedly attached to the second PCB by high speed staking methods.

20. The fixture of claim 15 wherein the cantilever beam spring latches are fixedly attached to the second PCB by nuts and bolts.

21. The fixture of claim 15 wherein the cantilever beam spring latches are fixedly attached to the second PCB by adhesives.

22. The fixture of claim 15 wherein the cantilever beam spring latches are fixedly attached to the second PCB by screws.

23. The fixture of claim 15 wherein the mating end of the first PCB further comprises a gradually narrowing width.

24. A method for creating co-planar or nearly co-planar edge-to-edge attachment of PCB's comprising:
   creating engagement notches on opposite edges of a mating end of a first PCB,
   attaching a first and second spring latch on opposite side edges of a second PCB,
   the spring latches each having an engagement lug,
   sliding the second PCB onto the mating end of the first PCB so that the first and second spring latches expand until each engagement lug engages the engagement notches of the mating end of the first PCB.

25. The method of claim 24 wherein the first and second spring latches comprise cantilever beam springs.

26. The method of claim 25 wherein the cantilever beam spring comprises resilient plastic.

27. The method of claim 25 wherein the cantilever beam spring comprises spring steel.

28. The method of claim 24 wherein the spring latches are fixedly attached to the second PCB by a high speed staking method.

29. The method of claim 24 wherein the spring latches are fixedly attached to the second PCB by rivets.

30. The method of claim 24 wherein the spring latches are fixedly attached to the second PCB by nuts and bolts.

\* \* \* \* \*